United States Patent [19]

Cannella et al.

[11] Patent Number: 4,907,088
[45] Date of Patent: Mar. 6, 1990

[54] CONTACT-TYPE IMAGER FOR USE AS THE FRONT END OF COPIER APPARATUS

[75] Inventors: Vincent D. Cannella, Birmingham; Zvi Yaniv, Farmington Hills, both of Mich.

[73] Assignee: Energy Conversion Devices, Inc., Troy, Mich.

[21] Appl. No.: 222,676

[22] Filed: Jul. 21, 1988

Related U.S. Application Data

[63] Continuation-in-part of Ser. No. 111,234, Oct. 22, 1987, Pat. No. 4,768,094, which is a continuation-in-part of Ser. No. 924,729, Oct. 30, 1986, Pat. No. 4,746,989, which is a continuation-in-part of Ser. No. 912,477, Sep. 29, 1986, Pat. No. 4,691,243, which is a continuation-in-part of Ser. No. 607,153, May 4, 1984, Pat. No. 4,660,095.

[51] Int. Cl.$^4$ .............................................. H04N 3/14
[52] U.S. Cl. .................................. 358/213.11; 358/482

[58] Field of Search .............. 358/294, 213.13, 213.29, 358/213.31, 212, 213.19, 213.22, 483, 482; 250/578; 357/24 LR, 30 H, 30 L

[56] References Cited

U.S. PATENT DOCUMENTS

| | | |
|---|---|---|
| 3,603,731 | 9/1971 | Weimer .......................... 358/213.19 |
| 3,696,250 | 10/1972 | Weimer .......................... 358/213.22 |
| 4,149,197 | 4/1979 | Kos et al. ............................. 358/294 |
| 4,482,804 | 11/1984 | Oritsuki et al. ................. 358/213.11 |

Primary Examiner—Jin F. Ng
Assistant Examiner—Stephen Brinich
Attorney, Agent, or Firm—Marvin S. Siskind; Richard M. Goldman; Kenneth M. Massaroni

[57] ABSTRACT

A copying system which includes the combination of a digitizing unit formed of an array of thin film photosensitive elements adapted to generate electrical signals indicative of a detectible image on an image-bearing surface and a replicating unit responsive to the photogenerated electrical signals for reproducing one or more hard copies of that detectible image.

17 Claims, 4 Drawing Sheets

CONTACT-TYPE IMAGER FOR USE AS THE FRONT END OF COPIER APPARATUS

RELATED APPLICATIONS

This application is a continuation-in-part application of copending U.S. patent application Ser. No. 111,234 filed Oct. 22, 1987, now U.S. Pat. No. 4,768,094, which is a continuation-in-part application of U.S. patent application Ser. No. 924,729 filed Oct. 30, 1986, now U.S. Pat. No. 4,746,989, which is a continuation-in-part application of U.S. patent application Ser. No. 912,477 filed Sept. 29, 1986, now U.S. Pat. No. 4,691,243, which is a continuation-in-part application of U.S. patent application Ser. No. 607,153 filed May 4, 1984, now U.S. Pat. No. 4,660,095.

FIELD OF THE INVENTION

The present invention generally relates to a copier system adapted to photogenerate electrical signals representative of an image on an image-bearing surface. The present invention more particularly relates to a copier system which includes an array of thin film, deposited, non-apertured photosensitive elements adapted to photogenerate electrical signals representative of a detectable condition on an image-bearing surface (such as a printed document wherein the image is detectable by sensing the difference in intensity of reflected radiation from the high and low optical density portions thereof). In its most specific form, the instant invention relates to a copier system in which the electrical signals are (1) photogenerated by an array of thin film, deposited, non-apertured photosensitive elements so as to have light emanating from small area portions of the image-bearing surface "proximity focused" onto associated ones of said elements; and (2) utilized by downstream apparatus to provide a hard copy reproduction of the image on said image-bearing surface.

BACKGROUND OF THE INVENTION

Electronic imaging or scanning systems are commonly used to transform an image on an image-bearing surface from one form, such as a paper original, to an electronic form, such as a digital or analog signal. Once an image is converted to an electronic form, many uses of that signal become possible, including, without limitation, the reproduction of the image onto a piece of paper, the projection of the image onto a video display terminal, the transmission of the image to a remote location, and the further processing of that image, such as by a computer, an optical pattern recognition device, or the like.

Electronic imaging systems typically include an array of photosensitive elements, such as photosensors, and a light source operatively disposed relative thereto so as to provide illumination of the surface being scanned. In those instances where a linear array of photosensitive elements is employed, it is necessary that either the image on that surface is moved in a direction perpendicular to the longitudinal axis of the linear array, or the linear array of photosensitive elements is moved in a direction perpendicular to the longitudinal axis of that surface. Alternatively, in those instances where a two dimensional array of photosensitive elements is employed, the entirety of the document may be instantaneously scanned without the need for initiating relative motion therebetween. Regardless of whether linear or two dimensional arrays of photosensitive elements are employed, the light reflected from the image-bearing surface varies depending upon the image on any small area portion of the surface being scanned; i.e., a darker small area portion of the surface will cause the photosensitive elements to receive less reflected light, while a brighter small area portion of the surface will cause the photosensitive elements to receive more reflected light. Since the photosensitive elements are adapted to effect a detectable change in the electrical conductivity thereof in response to the receipt of differing amounts of incident radiation, the change in conductivity can be detected and relayed in the form of electrical signals.

It should be appreciated by those ordinarily skilled in the art that electronic image scanning systems are of great commercial utility insofar as they permit the conversion of human readable data into electronic format, which format is compatible with various electronic processing, transmission and storage operations. Accordingly, electronic image scanners have gained acceptance in such diverse fields as publishing, finance, engineering, telecommunications and the graphic arts. Since electronic image scanners are essentially the "eyes" of data processing systems, their ubiquity should be as great as that of the desk-top computer terminal; however, such is not the case at the present point in time owing in part, to the expense, size and limited scanning capacity of heretofore available scanning systems.

The assignee of the subject invention has already developed large area electronic image scanners which are specifically adapted to reproducibly scan a pattern of information on a drafting table or a marker board and produce a digital signal corresponding thereto. Such large area scanners are disclosed in commonly assigned U.S. patent application Ser. No. 885,907 filed July 15, 1986 and entitled "Photosensitive Line Imager Utilizing A Movable Scanning Arm", now U.S. Pat. No. 4,725,889, the disclosure of which is incorporated herein by reference. Applicants, have also, in aforementioned U.S. patent application Ser. No. 111,234, developed a portable, small electronic image scanner which is relatively simple to operate and fairly inexpensive to produce. While such contact-type image scanning apparatus have been made commercially available as an adjunct to personal computing systems and the like, the use thereof for purposes of transmitting the digital signals photogenerated by the array of thin film photosensitive elements associated therewith to integrated copying systems for providing hard copy reproductions of images on image-bearing surfaces has yet to be commercialized.

BRIEF SUMMARY OF THE INVENTION

The aforementioned industrial needs are fulfilled by the apparatus disclosed and claimed herein. More specifically, the instant invention provides for a compact, low cost electrical image scanner capable of providing digital signals corresponding to information disposed upon an image-bearing surface, which digital signals are then transmitted to an integrally or remotely positioned reproduction unit for the creating of one or more hard copy reproductions of that information. As a matter of fact, the instant invention may be thought of as the front end of a smart copier, such as a copying machine which includes a contact-type digitizer in combination with, for instance, a laser printer.

The scanning element of the scanner-reproduction combination of the present invention may comprise a one dimensional portable digitizing unit or a stationary two dimensional matrix, either one of which is equipped with an array of thin film, ono-apertured photosensitive elements. Scanning of any information-bearing surface, may be readily accomplished by merely disposing the information-bearing surface so as to bring the array of photosensitive elements in close proximity relative thereto. In a preferred embodiment, the contact image scanner-copier of the instant invention is adapted for the (1) automatic scanning of image-bearing documents, and (2) integrated transmission of digitized signals therefrom to a copier for hard copy reproduction of the digitized electrical image in human recognizable format.

These and other features and advantages of the present invention will be apparent from the drawings, the brief description of the drawings and the detailed description of the drawings which follow.

Disclosed as part of the subject invention is a digital scanning unit adapted to photogenerate electrical signals representative of small area portions of an image on an image-bearing surface, which small area portions are projected onto corresponding small area photosensitive elements of an array housed within or adjacent to said unit. To this end, there is provided a contact-type digitizing scanning unit which is adapted to electronically scan a document or other image-bearing surface disposed in close proximity thereto and moved therepast. The array includes a plurality of spacedly disposed, continuous, small area, photosensitive elements formed from deposited, thin film, semiconductor alloy material operatively disposed and designed for receiving light reflected from said image. Each of these small area elements is capable of effecting a detectable electrical characteristic responsive to the intensity of light incident thereon and emanating from a corresponding small area portion of the image on the image bearing surface.

The array is fabricated so as to include at least one column of photosensitive elements operatively disposed upon a layer of transparent electrically conductive material, so as to cover at least a portion of at least one dimension of the image-bearing surface. A transparent protective cover layer underlies said photosensitive elements, said cover layer forming at least a part of a spacer which is operatively disposed for closely positioning the photosensitive elements in juxtaposed relation relative to said image-bearing surface so as to "proximity focus" light onto said photosensitive elements from corresponding small area portions of said surface. The protective cover layer is preferably formed of an abrasion resistant material selected from the group consisting essentially of a silicon-carbon alloy, a silicon-nitrogen alloy, a silicon-oxygen alloy or a microcrystalline carbon alloy. The semiconductor alloy material from which the photosensitive elements are fabricated is preferably selected from the group consisting essentially of silicon, germanium or combinations thereof and may further have one or more density of states reducing elements, such as hydrogen or fluorine, added thereto.

Preferably, associated with each of the photosensitive elements is an isolation element, such as a photodiode or a phototransistor for facilitating the selective addressing and detection of the electrical conductivity of each photosensitive element by the application of read potentials to respective pairs of address lines associated with each of said elements.

Also included as part of the digital scanning unit is a source for projecting light onto the image-bearing surface, said source operatively disposed on the side of the image-bearing surface closest to said cover layer. The light projecting source is adapted to transmit radiation through the interstitial segments of the array of photosensitive elements, said interstitial segments defined by the part of the surface area of the substrate not having photosensitive elements or isolation elements deposited thereupon. The electrical signals photogenerated by said photosensitive elements in response to radiation incident upon each photosensitive element can therefore be correlated by an associated, downstream, hard copy reproduction unit into a replication of the image of the image bearing surface.

Further, a static shielding layer may be interposed, as by vacuum deposition, between the photosensitive elements and the transparent protective layer. The static shielding layer is adapted to ensure that any static electrical discharge initiated by the relative motion between the digital scanning unit and the image-bearing surface cannot induce an electrical charge of sufficient potential in the adjacent array of photosensitive elements to deleteriously effect those elements.

In its most preferred embodiment, the contact-type digital scanning unit is employed in combination with a reproduction unit so that the digital signals photogenerated by the photosensitive elements thereof moving past an image-bearing surface are transmitted to that reproduction unit for hard copy print-out. Of course, other related apparatus such as display apparatus, memory buffing apparatus or related data processing apparatus can be interconnected between the scanning unit and the reproduction unit for manipulating the digitized signals prior to the hard copy print-out thereof.

DESCRIPTION OF THE PREFERRED EMBODIMENTS

Figure 1:
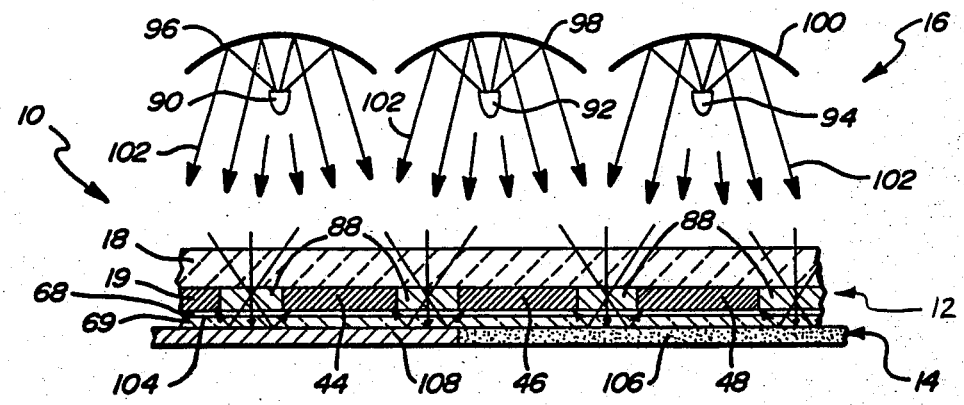
FIG. 1 is a partial side view, partly in cross section, of the digital scanning unit of the present invention, said scanning unit including an array of photosensitive elements adapted to scan an image on an image bearing surface disposed thereunder.
Figure 2:
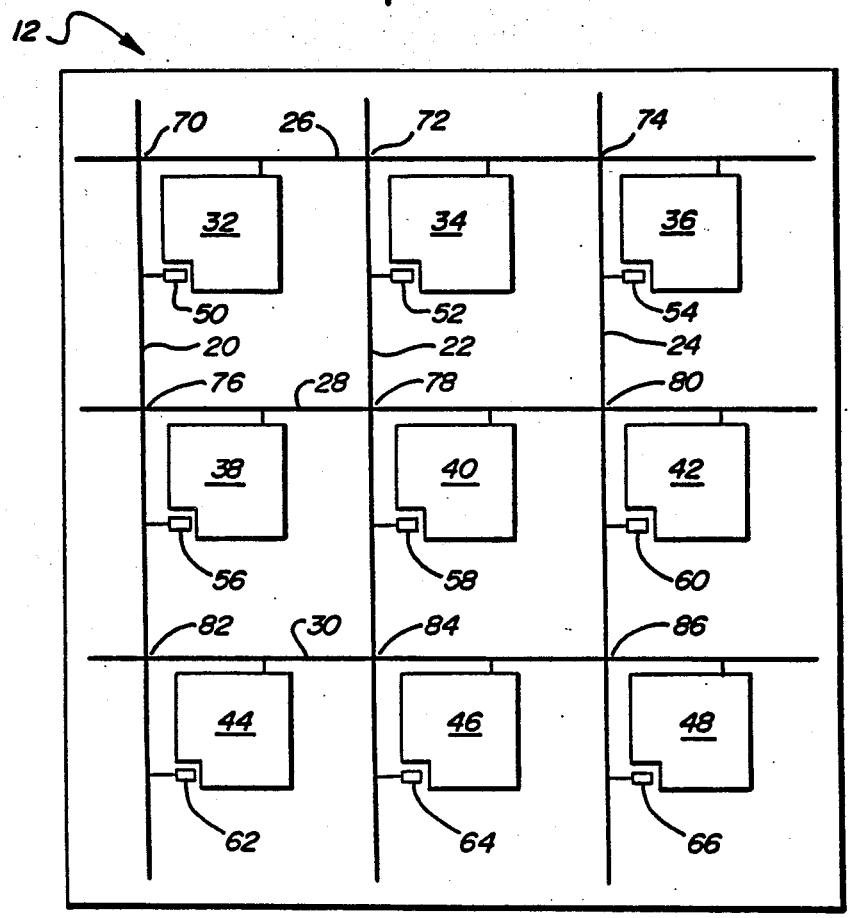
FIG. 2 is a stylistic top plan view illustrating the array of photosensitive elements at least partially housed within the scanning unit of FIG. 1 with those photosensitive elements and the associated isolation elements exposed.

FIGS. 1 and 2 illustrate a contact-type digitizing unit, generally referred to by the reference numeral 10, which unit 10 is adapted to be employed in combination with a reproduction unit 150 (see FIG. 6) so as to embody the concepts disclosed by the present invention. More specifically, the digitizing unit 10 illustrated in FIG. 1 generally includes (1) an array of photosensitive elements 12 adapted to provide electrical signals representative of a detectable condition of an image on an image-bearing surface, such as a document 14, disposed thereunder and (2) one or more light sources 16 is disposed thereover.

The array 12 includes a transparent substrate 18, which is formed from glass or some other rigid, transparent material; a first set of X address lines including address lines 20, 22 and 24; a second set of Y address lines including address lines 26, 28 and 30; and a plurality of discrete photosensitive elements 32, 34, 36, 38, 40, 42, 44, 46 and 48. The array 12 further includes isolation elements 50, 52, 54, 56, 58, 60, 62, 64 and 66, each one of which is respectively associated with a photosensitive element; and, if desired, a transparent, abrasion resistant protective layer 68.

As can be noted from a perusal of FIG. 2, the X address lines 20, 22 and 24 and the Y address lines 26, 28, and 30 cross at an angle, and, as will become more apparent from the description which follows hereinafter, are spaced from one another to form a plurality of cross-over points 70, 72, 74, 76, 78, 80, 82, 84 and 86. Associated with each of the cross-over points is a respective one of the photosensitive elements. The photosensitive elements 32-48 are formed on the transparent substrate 18 and are distributed thereover in spacedly disposed relation to form interstitial spaces 88 therebetween.

The photosensitive elements 32-48 are further formed to be of the type (such as photovoltaic diodes or photoresistors) which effect a detectable change in an electrical characteristic (such as electrical conductivity) in response to the receipt of incident light thereon. The photosensitive elements are preferably formed from a deposited semiconductor alloy material, such as an amorphous semiconductor alloy material. Preferably, the amorphous semiconductor alloy material includes a deposited thin film layer of amorphous silicon and/or amorphous germanium. Additionally, the layer of amorphous semiconductor alloy material also includes elements such as hydrogen and/or fluorine, which elements are adapted to reduce the density of defect states in the energy gap of the semiconductor alloy material. Such alloys can be deposited by plasma-assisted chemical vapor deposition, i.e., glow discharge, as disclosed, for example, in U.S. Pat. No. 4,226,898 which issued on Oct. 7, 1980 in the names of Stanford R. Ovshinsky and Arun Madan for Amorphous Semiconductors Equivalent to Crystalline Semiconductors Produced By A Glow Discharge Process.

Each of the isolation devices 50-66 is associated with a respective one of the photosensitive elements 32-48. The isolation devices are also preferably formed from a deposited thin film semiconductor alloy material, and most preferably, an amorphous semiconductor alloy material including silicon and/or germanium. The amorphous silicon and/or germanium alloy material may also include hydrogen and/or fluorine and can be deposited by plasma-assisted chemical vapor deposition as disclosed in the aforementioned U.S. Pat. No. 4,226,898. As can be noted in FIG. 2 hereof, each of the isolation device 50-66 is preferably coupled in series relation with its associated photosensitive element 32-48 between respective pairs of the X address lines 20, 22 and 24 and the Y address lines 26, 28 and 30. As should be readily apparent to skilled routineers in the art, other known types of multiplexing schemes may also be employed without departing from the spirit or scope of the subject invention. As a result, the isolation devices 50-66 facilitate the selective addressing and detection of the electrical conductivity of each of the photosensitive elements by the application of read potentials to respective pairs of the X and Y address lines.

Referring now more particularly to FIG. 1, the light source 16 comprises a plurality of individual light sources 90, 92 and 94; although a single, elongated light source, substantially coextensive in length with the length of the array of photosensitive elements, will work equally well, especially in the case of a linear array of multiplexed sensors. Associated with each of the sources 90, 92 and 94 is a reflector 96, 98 and 100. The light sources 90, 92 and 94 and the reflectors 96, 98 and 100 are arranged to provide diffuse light (as indicated by the arrows 102), which light is projected onto the digitizing unit 10 on the side of the substrate 18 opposite the image bearing surface 14 to be scanned. The image-bearing surface 14 is operatively disposed immediately beneath the protective layer 68, which protective layer includes a substantially planar, document-contacting surface 104.

The image-bearing surface 14 includes at least one image-bearing portion 106 of high optical density, hereinafter referred to as the dark portion of the image-bearing surface; and at least one portion 108 of low optical density, hereinafter referred to as the light portion of the image-bearing surface. The protective layer 68 is preferably formed to be relatively thin so that the image-bearing surface 14 is closely spaced in juxtaposed relation to the photosensitive elements, such as, photosensitive elements 44, 46 and 48 illustrated in FIG. 1. In this manner, light from the image-bearing surface 14 is "proximity focused" onto associated ones of the photosensitive elements. The thickness of the protective layer 68 is chosen to provide a maximum usable signal consistent with a number of other variable parameters. These variable parameters include the angular distribution of the diffuse light intensity, the width of the photosensitive elements and the spacing between adjacent ones of the photosensitive elements. While, in one embodiment, it is preferable that the thickness of the protective layer 68, the width of the photosensitive elements and the spacing between the photosensitive elements are all of a comparable dimension; in other preferred embodiments and depending upon the sensitivity of the photosensitive elements, the surface finish of the material from which image-bearing surface is fabricated, the pressure with which the image-bearing surface is urged against the protective layer and the strength of the light signal, it has been found that a wide range of relative dimensions may be employed. The key element which typifies this type of "proximity focusing" is a substantially one-toone relationship between the size of the small area portion of the image being sensed by any given small area photosensitive element and the size of the element itself.

In one embodiment (in which the substrate contacts the image-bearing member), the protective layer 68 may be affixed to the substrate 18 by a transparent adhesive (not shown). In that embodiment, the adhesive 110 is preferably a material having an index of refraction which matches the index of refraction of the substrate 18 to that of the protective layer 68 so as to minimize the reflection from the interfacial surface boundaries bordered by the matching materials.

In alternative embodiments, the protective layer 68 may be formed from a thin film of a transparent, abrasion-resistant material which is of less than 1 micron thickness, said thin film being vacuum deposited directly atop the upper electrode of the photosensitive elements. In this embodiment, the protective layer 68 is formed of wide band gap silicon-nitrogen alloys, silicon oxygen alloys, silicon carbon alloys or combinations thereof. These materials are transparent, hard, abrasion-resistant coatings which can also be fabricated to provide a hermetic seal to ambient conditions, the fabrication parameters of which in, for instance, glow discharge deposition systems, are well known to routineers skilled in the art.

The digitizing unit 10 of FIG. 1 additionally includes a static shielding layer, generally referred to by the reference numeral 69. This shielding layer 69 is incorporated into the copier system because the inventors of the subject application discovered that a static electrical charge of up to 600 volts or more could build up on the surface of the image-bearing surface 14 which movably contacts the array of photosensitive elements. It is possible that such a large static charge could induce a charge of similar magnitude in the photosensitive elements disposed immediately thereabove, which induced electrical charge is capable of destroying the diode switching characteristics of those elements. By vacuum depositing a thin film conductive layer, preferably formed of oxides of indium, tin, indium-tin, cadmium, zirconium or zinc between the photosensitive elements and the protective cover layer 69, the instant inventors further discovered that the static charge could be dissipated. Specifically, by connecting this shielding layer to ground potential (or to substantially the same potential as the photosensitive elements), the build-up static electrical charge on the image-bearing document 14 is substantially prevented from inducing a similar charge in the array of photosensitive elements 12. As would be apparent to a routineer in the art, the thickness of the shielding layer 69 need only be sufficient to fully cover the surface of the photosensitive elements on which it is deposited, i.e., about 500–2500 Angstroms. While the above referenced oxides constitute the preferred materials from which to fabricate the shielding layer 69, other conductive, transparent coatings such as thin, transparent non-agglomerating metallic films may be employed with equal advantage.

When the image-bearing surface 14 is to be scanned, the planar document-contacting surface 104 of the protective layer 68 of the digitizing unit 10 (or any other spacing or light collimating member) is placed into intimate contact with the image bearing surface so that the document is disposed in closely spaced juxtaposed relation to the array of photosensitive elements 12 housed therewithin. Then, the light source 16 is energized for projecting the rays of diffuse light 102 onto the back side of the digitizing unit 12 and then onto the surface of the image-bearing surface 14 adjacent the planar document-scanning surface 104. In the dark portions 106 of the image on the document 14, the light will be substantially absorbed so that very little of the light impinging upon the dark portions 106 will be reflected back onto the associated photosensitive elements of the digitizing unit 10 proximately disposed adjacent thereto; for example, photosensitive elements 48 and 46. However, the light striking the light portions 108 of the image-bearing surface on the document 14 will not be substantially absorbed and a substantially greater portion of the light impinging upon the light portions 108 will be reflected back onto the associated photosensitive elements proximately disposed adjacent thereto; such as photosensitive element 44. The photosensitive elements adjacent the light portions 108 of the document will thereby effect a detectable change in their electrical conductivity. When the photosensitive elements are formed as photovoltaic dopeds, they will not only effect a change in electrical conductivity, but they will also generate current. When the photosensitive elements are formed as photoresistors, they will effect an increased electrical conductivity which can be detected by the application of read potentials to the respective pairs of the X address lines 20, 22 and 24, and the Y address lines 26, 28 and 30.

Electrical signals representing a faithful reproduction of the image on the image-bearing surface 14 can be obtained because the photosensitive elements 32–48 can be made very small. For example, the photosensitive elements can be fabricated to have dimensions of approximately 60 microns on a side or less. The isolating elements 50–66 can be formed to have a dimension of about 10–40 microns on a side and preferably 20 microns on a side. Also, the photosensitive elements 32–48 are preferably spaced apart so that they cover only a portion of the substrate 18 so as to permit the light to be projected onto the image-bearing surface 14, whereby said document is scanned through the interstices which exist therebetween. For example, the photosensitive elements can be spaced so that they cover only a fraction (for example 25–50%) of the overall surface area of the substrate 18. Also, the photosensitive elements can be arranged in substantially coplanar relation so that each will be equally spaced in juxtaposed relation to the image-bearing surface 14 to be scanned. Although FIG. 2 illustrates a 3×3 matrix of photosensitive elements, it can be appreciated that a much larger array of photosensitive elements would be required in actual practice for scanning the entire surface area of a large area (8½"×11") image-bearing surface.

The electrical characteristics, and, in accordance with this preferred embodiment, the electrical conductivity of the photosensitive elements can be detected by applying read potentials to respective pairs of the X and Y address lines in series and one at a time. However, and most preferably, the photosensitive elements can be divided into groups of elements and the read potentials can be applied to each group of elements in parallel to facilitate a more rapid scanning of the image bearing surface 14. Of course, within each group of photosensitive elements, the elements can be scanned in series.

Figure 3:
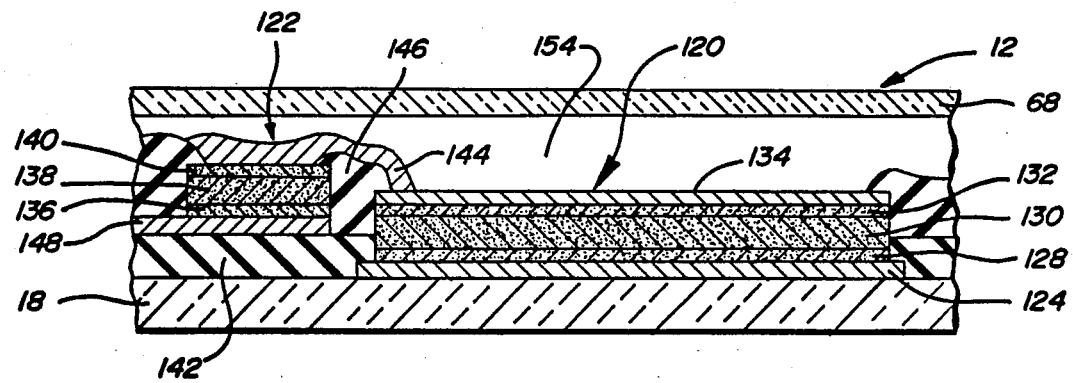
FIG. 3 is an enlarged, partial, cross-sectional side view illustrating a single one of the photosensitive elements and the associated isolation element depicted in FIG. 2.
Figure 4:
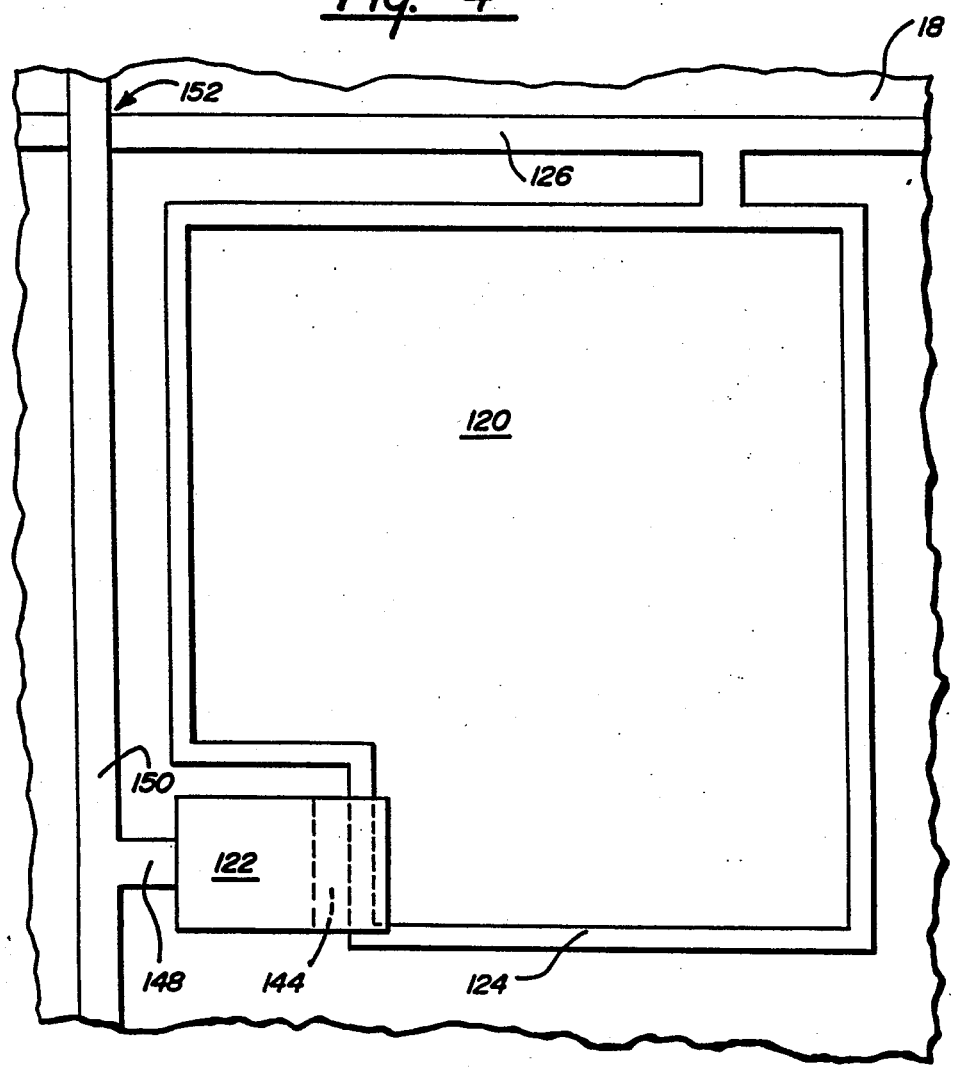
FIG. 4 is a top plan view of the photosensitive element and the associated isolation element illustrated in FIG. 3, which elements combine to define a single pixel of the array.

Referring now to FIGS. 3 and 4, there is illustrated in greater detail the operative configuration of a single photosensitive element 120 and an isolation device 122 structured in accordance with the principles of the present invention. Here, the illustrated pixel of the digitizing unit 10 of the copying system of the instant invention includes a transparent or glass substrate 18. Formed on the substrate 18 is a metal pad 124 which is electrically connected to a Y address line 126. The metal pad 124 can be formed from, for example, aluminum, chromium, or molybdenum.

Formed on the metal pad 124 is the photosensitive element 120 which preferably takes the form of a photovoltaic diode. The photovoltaic diode or other photosensitive element 120 can include an amorphous silicon or germanium alloy body fabricated by successively depositing a first doped region 128, an intrinsic region 130 and a second doped region 132. The regions 128 and 132 are preferably opposite in conductivity so that the region 128 is p-type and the region 132 is n-type. Overlying the n-type region 132 is a layer 134 of a transparent, electrically conductive oxide material such as indium tin oxide. Photovoltaic diodes of this type are fully disclosed, for example, in the aforementioned U.S. Pat. No. 4,226,898 and therefore, the techniques for the fabrication thereof need not be described in detail herein.

The metal pad 124 not only forms an ohmic contact with the photosensitive element 120, but in addition, serves to prevent light from reaching the back side of that photosensitive element. This function of the metal pad 124 is particularly important when the digitizing unit 10 is to be used in accordance with the embodiments illustrated herein. Of course, in those instances in which the image-bearing surface can be "back lit" (as described hereinafter), the light blocking function is not necessary, and the metal pad 124 may thus be transparent.

The isolation device 122, fabricated in accordance with this embodiment, comprises a diode, also formed from an amorphous silicon or germanium alloy material fabricated through the successive deposition of a p-type region 136, an intrinsic region 138 and an n-type region 140. The diode 122 is also formed on a metal pad 148, which pad 148 is formed on a layer of a deposited insulating material 142 fabricated from, for example, silicon oxide or silicon nitride. Since the isolation element 122 and the photosensitive element 120 include the same layer composition and structure, said isolation diode 122 can be formed during the same deposition operation as the photovoltaic diode 120. The isolation diode 122 is coupled to the photovoltaic diode 120 by an interconnect lead 144. Separating the isolation diode 122 from the photovoltaic diode 120 is a deposited insulator 146 which can also be formed from silicon oxide or silicon nitride. The metal pad 148 is coupled to an X address line 150. As can be best noted from FIG. 4, the X address line 150 and the Y address line 126 are spaced apart by the insulating layer 142. Because the address lines cross at an angle and are separated from one another, an insulated crossover point 152 is thereby formed.

The structure of FIG. 3 is completed by the superposed positioning of a transparent protective cover layer 68 (which can be formed from glass, plastic or the hard, abrasion resistant, transparent thin films described hereinabove) over the diode and the photosensitive element. When fabricated of thin film material, said protective cover layer 68 is vacuum deposited thereupon; and when fabricated of glass or plastic, said layer is adhered thereto by a transparent adhesive which can fill the space 154. The transparent adhesive preferably has an index of refraction (which may be for example 1.45-1.57) which is matched to the index of refraction of the glass substrate 18. Of course, the index of refraction of the substrate 18 is matched to that of the cover layer 68 so as to provide for the maximum transmission of light from the glass substrate through the protective cover layer.

Figure 5:
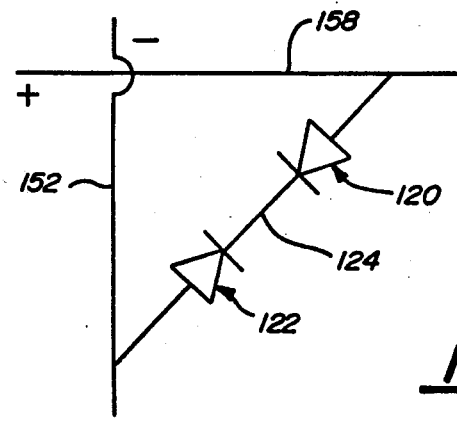
FIG. 5 is an equivalent circuit diagram of the photosensitive element and the associated isolation element depicted in FIG. 3, as those elements are operatively connected to the address lines of the x-y matrix which forms the array.

Referring now to FIG. 5, there is illustrated therein the equivalent circuit diagram of the photosensitive element 120 and the isolation element 122. The cathode of the isolation diode 122 and the cathode of the photosensitive element 120 are electrically coupled together in cathode to cathode relationship. The anode of the photosensitive element 120 is electrically coupled to the Y address line 158 and the anode of the isolation diode 122 is electrically coupled to the X address line 152. In order to read the condition of the photosensitive element 120, an electrical potential is applied to the X address line 152 and a second electrical potential is applied to the Y address line 158 to forward bias the isolation diode 122. If incident radiation is reflected off of a light (low density) small area portion of the image on the image bearing surface 14 and onto the corresponding small area photosensitive element 120, a current will be photogenerated by said photosensitive element and will be detected through the forward biased isolation diode 122. However, if the small area photosensitive element 120 is disposed to receive incident radiation reflected from an associated dark (high density) small area portion of the image bearing surface 14, substantially no light will be reflected from and be incident upon that photosensitive element; and hence substantially no current will be photogenerated by said photosensitive element. The difference between the two levels of photogenerated current can therefore be contrasted so as to provide an electrical signal representative of the small area image portions corresponding to each of the photosensitive elements.

Figure 6:
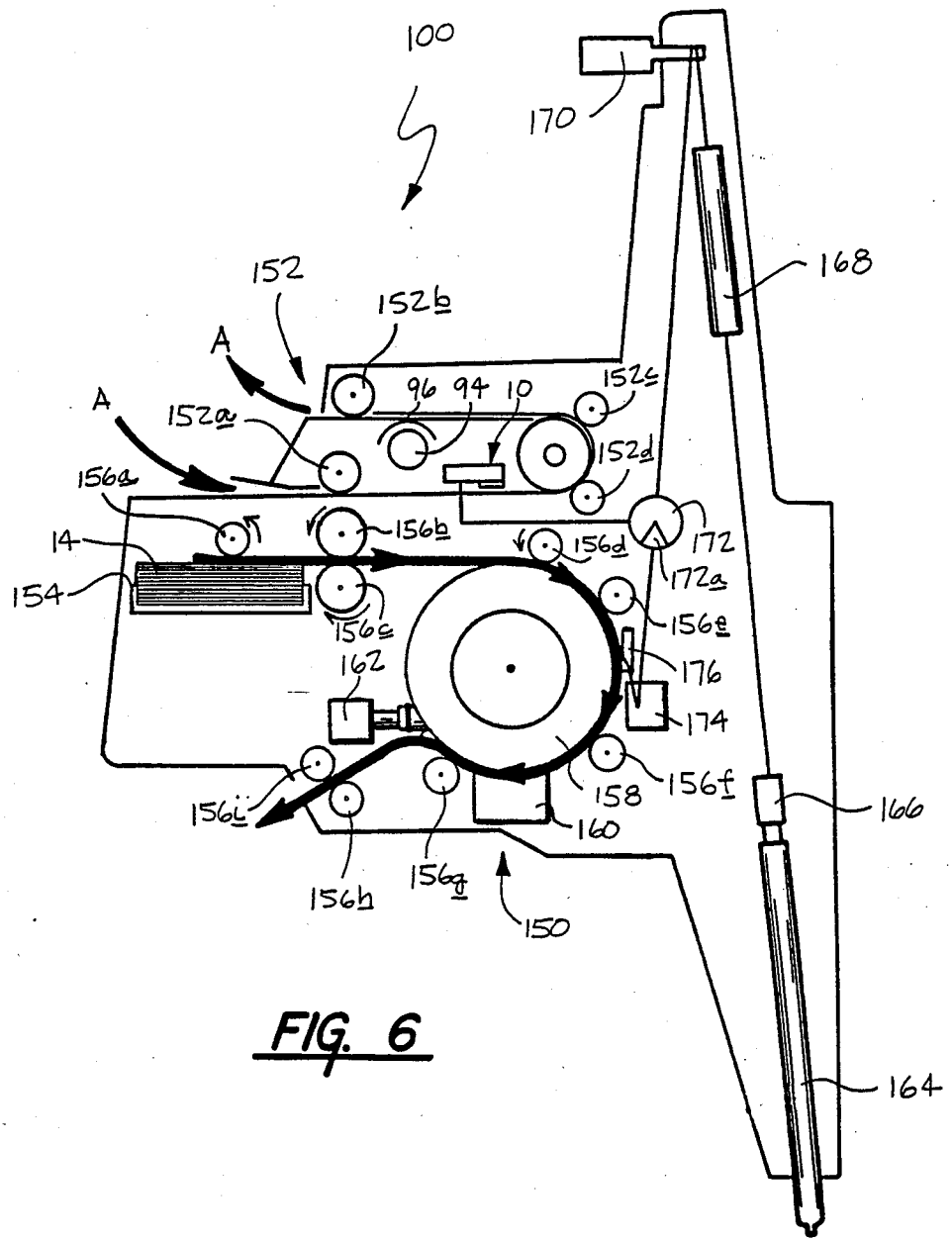
FIG. 6 is a schematic, side elevational view illustrating the digital scanning unit of FIG. 1 operatively communicating with a laser reproduction unit so as to provide the integrated copying system of the instant invention.

Referring now to FIGS. 6, there is illustrated therein the principal components of the copier system 200 of the instant invention, which copier system incorporates the digitizing unit 10 and a reproducing unit 150 described hereinafter. More particularly, FIG. 6 illustrates, in a stylized schematic view, one possible embodiment of the copier system 200 structured in accordance with the principles of the instant invention, as that system is operatively deployed for use so as to both (1) provide a detectable electrical signal corresponding to a surface condition existing upon small area portions of an image-bearing surface and (2) utilize that electrical signal to reproduce one or more hard copies of the surface condition on said image-bearing surface.

As referred to earlier, it will be noted that the digitizing unit 10 is preferably a generally elongated member which is shaped and sized so as to enable it to scan the entire width of a document or similar image-bearing surface 14 in a single pass. To that end and as should have been apparent from the previously described cutaway view of FIG. 1, the digitizing unit 10 preferably includes an elongated linear array of photosensitive elements 32–48. With specific respect to FIG. 6, those elements, which have been fully described hereinabove, are adapted to receive light from a corresponding small area portion of the surface of an image-bearing surface 14 fed from the paper feed tray 154 through the copier system 200 and generate a detectable electrical signal representative of the amount of reflected radiation received therefrom. It should be apparent that as the feed mechanism 152, which feed mechanism includes a plurality of motor driven rollers 152a–152d, moves the image-bearing surface 14 past the digitizing unit 10, the photosensitive elements of the array 12 are adapted to scan the entirety of that surface.

It is to be noted that also housed within and included as part of the digitizing unit 10 is an elongated light source, such as the type of fluorescent light source 94 described hereinabove. In this embodiment, the light source 94 is sufficiently elongated so as to be substantially coextensive in length with the length of the array 10 and operatively disposed relative to the linear array of photosensitive elements 12 and the image-bearing surface 14 so as to illumine the entirety of one dimension of the image-bearing surface being scanned. Therefore, the light source is preferably an elongated fluorescent tube having a reflector such as 96 disposed about a portion of the circumference thereof to reflect diffuse rays of light therefrom onto the image-bearing surface 14. The path of travel of the image-bearing surface is indicated by entry-exit arrows A—A illustrated in FIG. 6.

Now that the operative disposition and operation of the feed system of rollers (generally 152) for moving the image-bearing surface 14 past the digitizing unit 10 has been detailed, the feed system of rollers (generally 156) for providing hard copies which replicate the detectable condition on that image-bearing surface will be described. Specifically, interiorly of the housing of the copier system 200 of the instant invention there is disposed a paper tray 154 containing a plurality of blank sheets of paper therewithin. A roller assembly is utilized in order to move the initially blank sheets of paper from the paper tray 154 through reproduction unit 150. More particularly, roller 156a begins the movement of the individual sheets of paper from the paper tray 154 toward the electrophotograph drum 158. Rollers 156b and 156c continue that movement toward the drum and are disposed intermediate the path of travel from the paper tray 154 to that drum. Rollers 156d, 156e, 156f and 156g are substantially uniformly disposed about the circumference of the drum 158 so as to continue the path movement of the sheet of paper thereabout. Finally, rollers 156h and 156i direct the sheet of paper, now with the replicated image formed thereupon, out of the interior of the housing of the copier system 200 for retrieval by the operator thereof.

As for the writing system by which the digitized electrical signals photogenerated by the digitizing unit 10 of the instant invention are forwarded to the laser-/electrophotographic drum combination for reproduction of the image on the image-bearing surface 14 onto the blank sheets of paper from the feed tray 154 which are fed therepast, note the right half of the housing shown in FIG. 6. More particularly, a laser 164, which includes a modulator 166, directs a beam of light to a beam expander 168 from which the beam moves to a galvo mirror assembly 170 for reflection past a generally circularly shaped shutter assembly 172 to a spherical mirror 174 and a diagonal mirror 176. The diagonal mirror 176 moves the focused beam of light along the longitudinal extent of the drum 158 so as to write an image onto the peripheral surface thereof. The digitizing unit 10 is operatively connected to the rotatable shutter assembly 172, which assembly includes a generally wedge-shaped cutout portion 172a, for allowing the beam of light directed from the galvo mirror assembly 170 to past therethrough to the spherical mirror 174. In operation, when electrical signals are received from the digitizing unit 10 indicative of the dark small area portions of the image-bearing surface 14, no light is permitted to pass through the wedge-shaped portion 172a of the shutter assembly 172. However, when electrical signals are received from the digitizing unit 10 indicative of light small area portions of the image-bearing surface 14, the shutter assembly 172 is rotated so that the wedge-shaped portion 172a thereof is moved into alignment with the laser beam. In this manner, the laser beam is permitted to write upon the peripheral surface of the electrophotographic drum. The electrophotographic drum is rotated by stepper motor 162 and the electrostatic image formed on the surface of the drum by the laser beam is adapted to attract toner from the storage container 160, which toner is then transferred onto the blank sheet of paper from the paper feed tray 154 moving therepast and in contact therewith.

It is to be noted that there are many variations of such laser reproduction units 150 now in existence and any one of these various embodiments may be used with equal advantage in practicing the principles of the invention disclosed herein. Even aside from the use of laser printers, other types of reproduction units, such as ink jet printers may also be employed in combination with the digitizing unit without departing from the spirit or scope of the instant invention. It is therefore to be appreciated that the downstream hard copy replication unit of this invention need only be capable of receiving and processing digitized signals generated by the digitizing unit in order to effectively in provide the image reproduction capabilities.

Figure 7A:
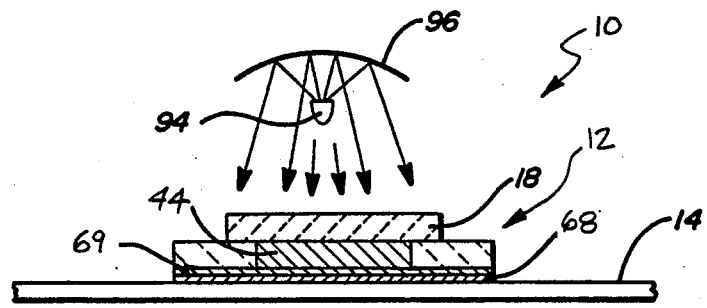
FIG. 7A is a stylized, cross-sectional, side elevation view depicting the use of a contact imaging technique in which incident radiation is reflected from an image on the image-bearing surface onto a corresponding photosensitive element of the array illustrated in FIG. 2.

Referring now to FIG. 7A, there is shown one mode of operation of the array of photosensitive elements 12, as that array is specifically adapted to scan a pattern of information disposed upon an image-bearing surface 14 (such as a document or other similar sheet of material). As illustrated in FIG. 7A, the array 12 is generally similar in structure to that discussed previously with reference to FIG. 1; and preferably, includes a substrate 18 having a one or more of discrete, linearly aligned photosensitive elements such as 44 (one of which is shown in stylized cross-section of FIG. 3). The array of photosensitive elements, as depicted in FIG. 7A, further includes a protective, hard, transparent coating 68 and the transparent static shielding layer 69, as discussed hereinabove.

As illustrated in FIG. 7A, the array of photosensitive elements 12 operatively disposed as part of the digitizing unit 10 is adapted to operate in a proximity focusing mode, that is to say, said array of photosensitive elements 12 is maintained in relatively close proximity to the image-bearing surface 14 being scanned. This close proximity relationship is maintained by a transparent spacing member; in this instance the spacing member being the aforementioned combination of the hard coating 68 and the static shielding layer 69. Of course, other arrangements for spacing the array from the image-bearing surface 14 may be employed with equal advantage. In a proximity focused mode of operation, a light source 94 is operatively disposed adjacent the digitizing unit 10 so as to direct radiation of a preselected wavelength upon the image-bearing surface 14 in such a manner that radiation reflected from small area portions of that surface will strike corresponding small area photosensitive elements maintained in close proximity thereto. Because of the close spatial relationship which exists between the discrete photosensitive elements and the corresponding small area portions of the image on the image-bearing surface 14, each small area photosensitive element is illuminated only by light emanating from corresponding small area portions of the image-bearing surface 14. In this manner, the image is essentially "focused" onto the individual photosensitive elements without the need for optical amplifying or reducing lenses.

It should be apparent that the proximity focusing system shown with reference to FIG. 7A may be modified and still retain its essential function. For example, the transparent protective coating 68 may be replaced by another transparent material such as glass or a synthetic polymeric material, either with or without an optional hard coating upon the surface which engages the image-bearing surface 14 being scanned. In some instances, the transparent protective coating 68 may be completely eliminated and the proximity relationship of the array of photosensitive elements 12 to the small area portions of the image-bearing surface 14 may be maintained by mechanical control of the position of both the image-bearing surface 14 and the array of photosensitive elements 12. It is to be understood that other optical arrangements may also be utilized to focus radiation reflected from a portion of the image of said image-bearing surface 14 onto corresponding portions of the array of photosensitive elements 12 without departing from the spirit or scope of the instant invention.

Figure 7B:
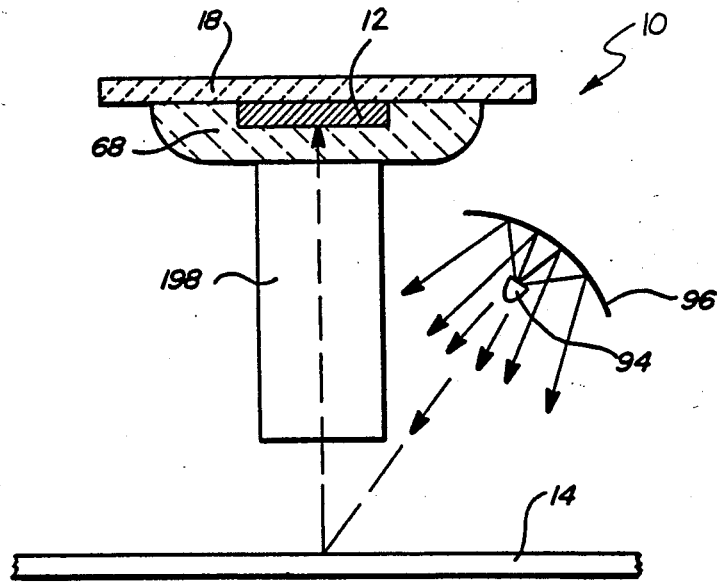
FIG. 7B is a stylized, cross-sectional, side elevational view depicting the use of an optical lens assembly in which incident radiation is reflected from an image on an image-bearing surface onto a corresponding photosensitive element of the array illustrated in FIG. 1.

Referring now to FIG. 7B, there is shown one such alternative optical arrangement which employs an elongated, generally cylindrically-shaped, fiber-optic-like lens 198 for directing incident radiation from a small area portion of the image-bearing surface 14 to the appropriate small area photosensitive element of the large area array. As shown in FIG. 7B, light emanating from the light source 94 is reflected from a small area portion of the image-bearing surface 14 being scanned, in all directions including the direction substantially perpendicular to the plane of the image-bearing surface 14. Arranged substantially perpendicular to the plane of the image-surface 14 is an elongated, linear, non-inverting imaging lens 198, as for example, a one-to-one magnification ratio lens produced by Nippon Sheet Glass Company, Limited of Tokyo, Japan (Selfoc lens array, Cat. No. SLA-09). It is to be noted that the precise dimensions of the surface area viewed for imaging by each of the photosensitive elements of the array will depend upon the specific lens selected.

As should be apparent to those ordinarily skilled in the art, other modifications of the optical system may be made in keeping with the spirit and scope of the instant invention. For example, the cylindrical lens 198 may be replaced with a more conventional type of lens. Likewise, a fiber-optic element may be utilized to convey incident radiation to a given photosensitive element from a corresponding small area portion of the image-bearing surface 14 without loss. It is even possible to employ a fiber-optic faceplate, i.e., a large bundle of fused fibers with two-three times better light transmission capabilities, vis-a-vis, Selfoc lenses. It is only necessary to remember that such optical fibers have no focusing capabilities so the fiber must be maintained in substantially close relationship to the image-bearing surface.

It should be understood that the present invention is not limited to the precise structure illustrated in the described embodiment. It is intended rather that the foregoing description be regarded as illustrating said invention rather than limiting it. It is therefore the following Claims, including all equivalents, which define the scope of the instant invention.

We claim:

1. A copier system including (1) an array of photosensitive elements adapted to photogenerate electrical signals representative of an image on an image-bearing surface and (2) replicating apparatus adapted to use the photogenerated electrical signals to reproduce the image; said system comprising in combination;

an array of photosensitive elements fabricated from thin film semiconductor alloy material; each of said elements being non-light transmissive, non-apertured, continuous and capable of receiving light from a corresponding small area portion of an image-bearing surface and generating a detectable electrical signal representative of the amount of received light;

said array including at least one column of photosensitive elements operatively disposed so as to cover at least a portion of at least one dimension of an image-bearing surface;

spacing means including a protective cover layer underlying said array of photosensitive elements for closely positioning said array in juxtaposed relation relative to an image-bearing surface so as to proximity focus light onto said photosensitive elements from corresponding small area portions of said surface; said cover layer formed of a transparent abrasion resistant material selected from the group consisting essentially of a silicon-carbon alloy, a silicon-nitrogen alloy, a silicon-oxygen alloy, microcrystalline carbon, and combinations thereof; and replicating apparatus including means responsive to the electrical signals photogenerated by said array of photosensitive elements for providing a hard copy reproduction of the image on said image-bearing surface.

2. A system as in claim 1, further including shielding means operatively disposed between a lower electrode of said array of photosensitive elements and said protective cover layer, said shielding means adapted to prevent the build-up of a large static charge occasioned by the relative movement of the array of photosensitive elements and an image-bearing surface; and said shielding means fabricated from a material selected from the group consisting essentially of an oxide of indium, tin, zinc, zirconium, cadmium, gold, silver, aluminum, copper, and combinations thereof.

3. A system as in claim 2, wherein said shielding means is electrically connected to ground potential.

4. A system as in claim 1, wherein the photosensitive elements are fabricated from a thin film semiconductor alloy material selected from the group consisting essentially of a silicon alloy, a germanium alloy, and combinations thereof.

5. A system as in claim 1, wherein said photosensitive elements are fabricated as P-I-N type photovoltaic diodes.

6. A system as in claim 1, further including isolation means associated with each of said photosensitive elements for facilitating the selective addressing of discrete elements.

7. A system as in claim 6, wherein each isolation means is a diode.

8. A system as in claim 1, further including means for projecting light onto said image-bearing surface.

9. A system as in claim 8, wherein each of the photosensitive elements further includes first and second electrodes.

10. A system as in claim 9, wherein each of the first electrodes of said photosensitive elements are formed upon said substrate as distinct, thin film, conductive pads; and each photosensitive element and the associated isolation means thereof are formed upon and electrically interconnected by said conductive pad.

11. A system as in claim 10, wherein said substrate is transparent and the conductive pads of said photosensitive elements are spacedly disposed so that light passes through said substrate and between and around said conductive pads to illuminate said image-bearing surface.

12. A system as in claim 1, wherein said array is a 1-dimensional matrix of photosensitive elements movable past said image-bearing surface for the line-by-line scanning thereof.

13. A system as in claim 1, wherein said replicating means is a copier machine.

14. A system as in claim 13, wherein said copier machine employs an electrostatic photoreceptor drum.

15. A system as in claim 13, wherein said copier machine employs a printer.

16. A system as in claim 15, wherein said printer includes a laser.

17. A system as in claim 13, wherein said copier machine employs ink jet means.

* * * * *